United States Patent [19]

Kearney

[11] Patent Number: 4,959,622

[45] Date of Patent: Sep. 25, 1990

[54] OPERATIONAL AMPLIFIER WITH PRECISE BIAS CURRENT CONTROL

[75] Inventor: Mark B. Kearney, Kokomo, Ind.

[73] Assignee: Delco Electronics Corporation, Kokomo, Ind.

[21] Appl. No.: 401,205

[22] Filed: Aug. 31, 1989

[51] Int. Cl.$^5$ .................................................. H03F 3/45
[52] U.S. Cl. ...................................... 330/257; 330/259; 330/311
[58] Field of Search ................ 330/257, 259, 261, 311

[56] References Cited

U.S. PATENT DOCUMENTS 4,525,663  6/1985  Henry ............................. 330/257 X
4,857,862  8/1989  Brokaw ............................... 330/261

Primary Examiner—James B. Mullins
Attorney, Agent, or Firm—Albert F. Duke

[57] ABSTRACT

An operational amplifier of the folded cascode type is disclosed and includes a differential input stage, connected with a differential to single ended output stage, a current mirror is interconnected with both stages for maintaining a precise relationship between bias current in the two stages.

5 Claims, 2 Drawing Sheets

OPERATIONAL AMPLIFIER WITH PRECISE BIAS CURRENT CONTROL

FIELD OF THE INVENTION

This invention relates to operational amplifiers and more particularly to an improved operational amplifier of the type comprising a folded cascode differential input stage wherein the bias or quiescent currents in the input stage are precisely controlled by a current mirror which senses the current in the output stage.

BACKGROUND OF THE INVENTION

Folded cascode differential stages are useful for single-supply, low voltage, integrated circuit operational amplifiers for several reasons, including the ability to handle a wide common-mode input voltage range, the capability to provide both voltage translation and differential to single-ended current conversion, operation over a wide range of supply voltages, and ease of implementation in an integrated circuit.

In prior art operational amplifiers the bias current levels are determined by a current source $I_s$ connected with the input stage and a bias voltage VB connected with a differential to single ended output stage. However, care must be taken in the generation of $I_s$ because of the direct effect variations in $I_s$ have on the current I2 in the output stage. If the current $I_s$ is too large, I2 may be reduced to zero. Conversely, if the current $I_s$ is too low in value, the differential current in the input stage may not be large enough to be significant when compared to mismatch currents in the output stage. These conditions put upper and lower bounds on $I_s$ relative to I2 and a good choice for the value of $I_s$ is equal to the desired value of I2. The current source $I_s$ is typically established with a "Widlar" current source including resistors which makes it difficult to maintain a precise relationship between $I_s$ and I2.

SUMMARY OF THE INVENTION

In accordance with the present invention a precise relationship between $I_s$ and I2 is provided by applying the I2 currents to the input current path of a standard current mirror and connecting the output current path of the current mirror with the differential input stage. This configuration allows I2 to be set as an independent value based only on the bias voltage VB and resistors in the output stage.

BRIEF DESCRIPTION OF THE DRAWINGS

The above and other advantages of the invention will become more apparent from the following description taken in conjunction with the accompanying drawings wherein like references refer to like parts and wherein.

DETAILED DESCRIPTION

Figure 1A:
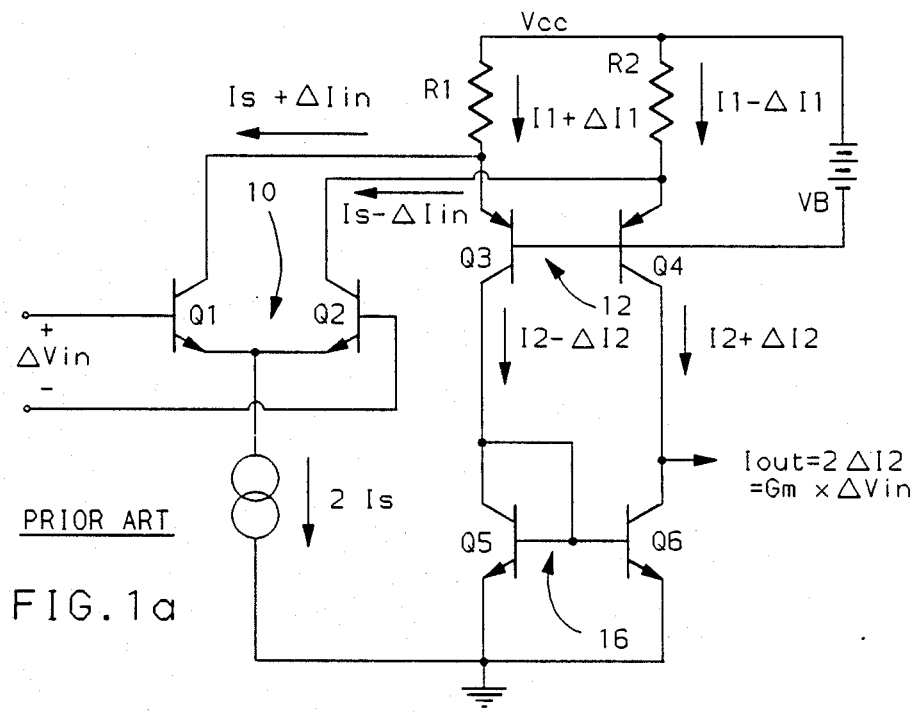
FIGS. 1a and 1b disclose a prior art amplifier circuit.

Referring now to the drawing and initially to FIG. 1a, a prior art amplifier is shown and functions in the following manner. A differential input voltage, $\Delta Vin$, is applied to an input stage generally designated 10 which includes a common emitter differential transistor pair Q1 and Q2, biased by current source Is. Differential signal current $\Delta Iin$ results and appears in the collector currents of Q1 and Q2 which are then applied to the folded cascode stage generally designated 12 and comprised of equal-valued resistors R1 and R2 and transistors Q3 and Q4. The action of the folded cascode stage causes differential current $\Delta I2$ to appear in the collector currents of Q3 and Q4 which are applied to a current mirror generally designated 16 formed by Q5 and Q6. The action of this current mirror causes a differential to single-ended conversion at the output node, forcing $2\Delta I2$ to be passed to the next stage of the amplifier.

An important parameter affecting the operation of a differential stage of this type is the overall transconductance, the ratio of the output current ($\Delta Iout$) to the differential input voltage ($\Delta Vin$). Evaluation of the small-signal node equations for the circuit of FIG. 1a gives a result for the overall transconductance (Gm) as:

$$Gm = \frac{\Delta Iout}{\Delta Vin} = \frac{R1}{re1} \times \frac{1}{re3 + R1} \quad (1)$$

where:
R1=R2
re1=re2=dynamic emitter resistance of Q1 & Q2
re3=re4=dynamic emitter resistance of Q3 & Q4

To maintain a constant overall transconductance over the amplifier's operating conditions, the dynamic emitter resistances (re's) of transistors Q1–Q4 must be controlled. The dynamic emitter resistance of a bipolar junction transistor is expressed as:

$$re = \frac{kT}{q\,Ie}, \quad (2)$$

where
k=Boltzman's constant (1.38E-23 Joules/degree K),
T=absolute temperature (degrees Kelvin),
q=the charge of an electron (1.6E-19 coulomb), and
Ie is the emitter bias current of the transistor.

Since the dynamic emitter resistances are established by the respective emitter bias current levels in each transistor, it is desirable that these currents be established in a predictable and repeatable fashion. It also follows from the relationship for re, in (2), that by making the emitter current of a transistor substantially proportional to absolute temperature, the variation in re over the operating temperature range of the device are minimized. This will then desensitize the overall transconductance, Gm, to temperature.

The bias current levels in the circuit of FIG. 1a are determined by the current source 2Is and a bias voltage source, VB. Transistors Q1 and Q2 divide current 2Is equally, with each operating at Is. The currents in Q3 and Q4, represented in FIG. 1a as I2, are then determined by subtracting the collector currents of the input stage (Is) from the currents flowing in resistors R1 and R2. The currents in R1 and R2 are established by the voltage source VB minus the base-emitter diode drops of Q3 and Q4 and are represented in FIG. 1a as I1.

Figure 1B:
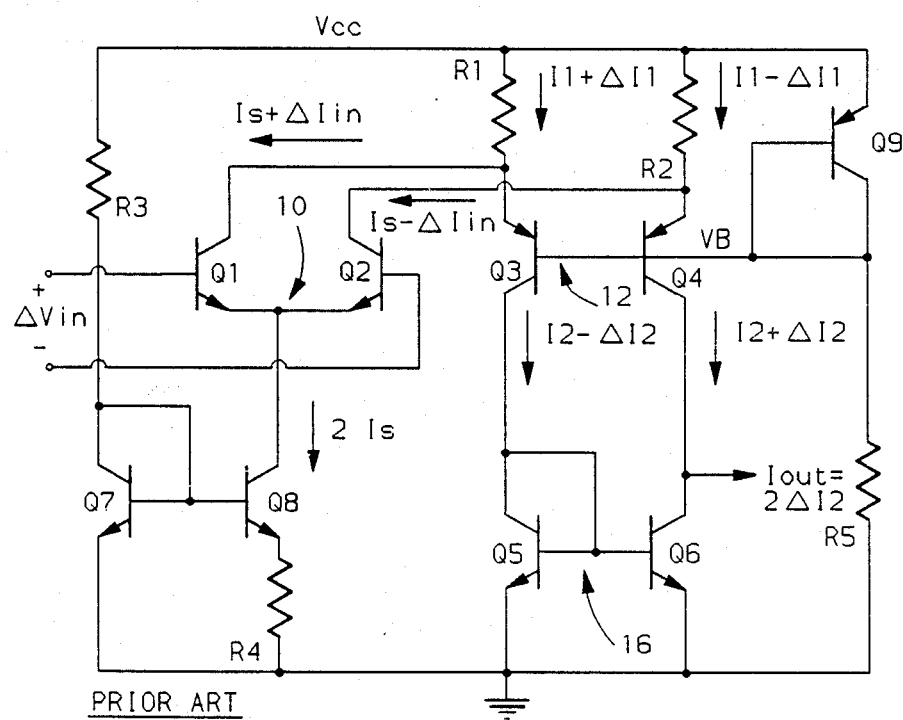

The circuit of FIG. 1b shows a method of biasing the circuit such that the emitter currents are substantially proportional to absolute temperature and the temperature independence of Gm is achieved Transistors Q7–Q8 and resistors R3–R4 form a "Widlar" current source for providing current 2Is proportional to absolute temperature. Diode connected transistor Q9 and resistor R5 are used to generate the voltage source VB. As long as the Is currents are maintained proportional to absolute temperature, it follows that the I2 currents will also be proportional to absolute temperature. Use of the relatively low voltage for VB also improves low voltage operation of the circuit.

However, care must be taken in the generation of current 2Is when VB is set to a diode drop because of the direct effect variations in Is have on I2. If the Is currents are too large, I2 may be reduced to a very low, value and the transconductance Gm will be affected. Conversely, if the Is currents are too low in value, the differential current ΔI1 may not be large enough to be significant when compared to potential mismatch currents in Q3 and Q4. These conditions put upper and lower bounds on Is relative to I2, and a good choice for the value of Is is equal to desired value of I2. While the "Widlar" current source of FIG. 1b has an advantage of being able to generate small values for Is without large resistor values, it makes it more difficult to maintain a precise relationship between Is and I2

Figure 2:
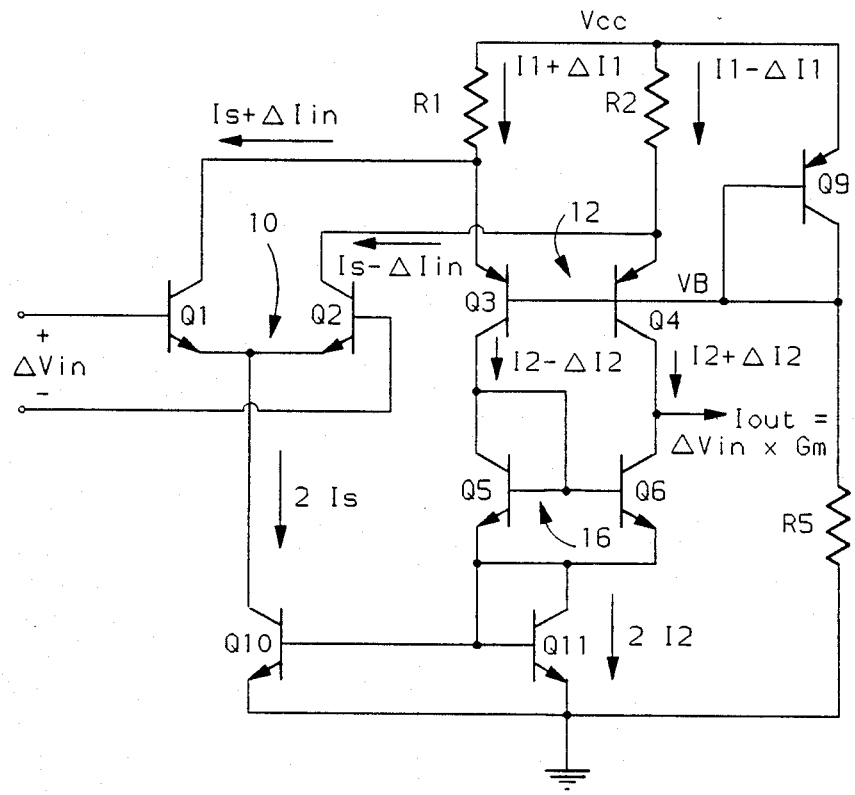
FIG. 2 is a schematic of the amplifier of the present invention.

The present invention is shown in FIG. 2 and solves the problem by providing a means to force current 2Is equal to twice the value of I2, allowing I2 to be set as an independent value based only on the bias voltage VB and resistors R1 and R2. This is accomplished by summing the I2 currents from Q5 and Q6 and generating current 2Is equal to the resultant summed current with a standard current mirror. The advantage of this approach is that it allows a simple means of maintaining a precise rerelationship between Is and I2, allowing I2 to be established without concern for variations in Is. The resultant circuit also eliminates the need for resistors R3 and R4 from FIG. 1(b), allowing a simpler overall circuit.

In the improved differential stage shown in FIG. 2, transistors Q10 and Q11 form a standard current mirror to generate Is from the sum of the two I2 current paths as previously described. Since Is is equal to I2 the current I1 flowing in resistors R1 and R2 is equal to 2I2. Thus, all currents may be properly established by choosing appropriate values for resistors R1 and R2, and the voltage bias source, VB.

I claim:

The embodiments of the invention in which an exclusive property or privilege is claimed are defined as follows:

1. In an operational amplifier comprising a differential input stage and a separate differential to single ended output stage, and means for establishing bias currents in said input and output stages, the improvement comprising a current mirror including an input current path and an output current path, means connecting said input current path with the combined currents in said output stage and means connecting said output current path with said input stage, whereby the combined bias currents in said input stage are precisely controlled relative to the combined bias currents in said output stage.

2. In an operational amplifier comprising a differential input stage, having first and second current conducting paths, connected with a differential output stage having third and fourth current conducting paths, and means for establishing bias currents in said first and second paths and in said third and fourth paths, the improvement comprising a current mirror including an input current path and an output current path, means supplying said input current path with the combined currents in said third and fourth paths and means connecting said output current path with said first and second paths, whereby the combined bias currents in said input stage are precisely controlled relative to the combined bias currents in said output stage.

3. A differential amplifier of the folded-cascode type, comprising, a differential input stage comprising first and second transistors, an output stage comprising third and fourth transistors, a first current mirror comprising fifth and sixth transistors, a second current mirror comprising seventh and eight transistors, each of said transistors having emitter, collector and base electrodes, a first resistor connecting the collector of said first transistor and the emitter of said third transistor to a source of voltage, a second resistor connecting the collector of said second transistor and the emitter of said fourth transistor to said source of voltage, bias voltage means for establishing equal bias currents in said first and second resistors, said first current mirror connected with said third and fourth transistors to provide a single ended output, said eight transistor being connected as a diode and connected with said first current mirror to receive the combined collector currents of said third and fourth transistors, said seventh transistor connected with the emitters of said first and second transistors, whereby the combined bias currents in the collectors of said first and second transistors are precisely controlled relative to the combined collector currents in said third and fourth transistors.

4. A differential amplifier of the folded-cascode type, comprising, a differential input stage comprising first and second transistors, an output stage comprising third and fourth transistors, a first current mirror comprising fifth and sixth transistors, a second current mirror comprising seventh and eight transistors, each of said transistors having input, output and common electrodes, a first resistor connecting the output electrode of said first transistor and the common electrode of said third transistor to a source of voltage, a second resistor connecting the output electrode of said second transistor and the common electrode of said fourth transistor to said source of voltage, bias voltage means for establishing equal bias currents in said first and second resistors, said first current mirror connected with said third and fourth transistor to provide a single ended output, said eight transistor being connected as a diode and connected with said first current mirror to receive the combined output currents of said third and fourth transistors, said seventh transistor connected with the common electrodes of said first and second transistors, whereby the combined bias currents in the output electrodes of said first and second transistors is precisely controlled relative to the combined bias currents in the output electrodes of said third and fourth transistors.

5. In a folded cascode amplifier having a differential input stage comprising first and second transistors having emitter, base and collector electrodes, means applying an input voltage applied across base electrodes of said first and second transistors to produce differential signal current in the collector electrodes thereof, said folded cascode amplifier including third and fourth transistors having emitter, base and collector electrodes, first and second resistors having one side connected to a voltage source and the other side connected to both the emitter electrodes of said third and fourth transistors and the collector electrodes of said first and second transistors, means establishing a bias voltage source at the base electrodes of said third and fourth transistors, a current mirror comprising fifth and sixth transistors having emitter, base and collector electrodes, said fifth transistor connected as a diode, the collectors of said fifth and sixth transistor connected to respective collectors of said third and fourth transistors, the respective emitter electrodes and the respective base electrodes of said fifth and sixth transistors being connected together, said current mirror providing an output at the collector of said sixth transistor, the improvement comprising a second current mirror including seventh and eight transistors having emitter, base and collector electrodes, the collector electrode of said seventh transistor connected with the emitter electrodes of said first and second transistors, the collector electrode of said eight transistor connected to each emitter electrode of said fifth and sixth transistor, the emitter electrodes of said seventh and eight transistor connected to a reference potential, the base electrodes of said seventh and eight transistors connected together and the collector and base electrodes of said eight transistor connected together to form a diode, whereby a precise relationship is established between the bias currents flowing in the collector electrodes of said first and second transistors and the bias currents flowing in the collector electrodes of said third and fourth transistors.

* * * * *